(12) United States Patent
Futagawa et al.

(10) Patent No.: US 6,309,525 B2
(45) Date of Patent: *Oct. 30, 2001

(54) SPUTTERING APPARATUS CAPABLE OF CHANGING DISTANCE BETWEEN SUBSTRATE AND DEPOSITION PREVENTING PLATE USED FOR FILM FORMATION

(75) Inventors: Masayasu Futagawa, Nabari; Kiyoshi Mito, Uda-gun, both of (JP)

(73) Assignee: Sharp Kabushiki Kaisha, Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/251,642

(22) Filed: Feb. 17, 1999

(30) Foreign Application Priority Data

Feb. 17, 1998 (JP) .................................................. 10-033438
Feb. 26, 1998 (JP) .................................................. 10-045034

(51) Int. Cl.[7] ............................ C23C 14/04; C23C 14/34
(52) U.S. Cl. ................ 204/298.11; 204/298.15; 204/298.25; 204/298.23; 204/298.09; 204/298.14
(58) Field of Search ...................... 204/298.11–298.15, 204/298.25, 298.23, 298.09, 298.14

(56) References Cited

U.S. PATENT DOCUMENTS

| | | | |
|---|---|---|---|
| 4,943,363 * | 7/1990 | Zejda et al. ...................... 204/198.25 |
| 5,540,821 * | 7/1996 | Tepman ............................ 204/298.11 |
| 5,597,459 * | 1/1997 | Altshuler .......................... 204/298.09 |
| 5,738,767 | 4/1998 | Coad et al. ....................... 204/192.12 |
| 5,804,042 * | 9/1998 | Ferreira et al. ........................ 204/298 |
| 5,851,299 * | 12/1998 | Cheng et al. .................... 204/298.11 |
| 5,863,340 * | 1/1999 | Flanigan ........................... 204/298.11 |

FOREIGN PATENT DOCUMENTS

| | | |
|---|---|---|
| 63033555 A | 2/1988 | (JP) . |
| 04137522 A | 5/1992 | (JP) . |
| 5-82444 * | 4/1993 | (JP) ................................ 204/298.11 |
| 06069316 A | 3/1994 | (JP) . |
| 6-108239 * | 4/1994 | (JP) ................................ 204/298.11 |
| 83744 | 9/1996 | (JP) . |
| 09059776 A | 3/1997 | (JP) . |
| 09143733 A | 6/1997 | (JP) . |

* cited by examiner

Primary Examiner—Mark F. Huff
Assistant Examiner—Daborah Chacko-Davis
(74) Attorney, Agent, or Firm—David G. Conlin; William J. Daley, Jr.; Dike, Bronstein, Roberts and Cushman, Intellectual Property Practice Group

(57) ABSTRACT

A sputtering apparatus for forming a sputtered film on a substrate held on a substrate holder in a vacuum chamber includes a target, a deposition preventing plate provided between the target and the substrate holder, a substrate holder carrying mechanism, and a moving mechanism for moving the substrate holder carrying mechanism to change a distance between the substrate and the deposition preventing plate.

14 Claims, 8 Drawing Sheets

SPUTTERING APPARATUS CAPABLE OF CHANGING DISTANCE BETWEEN SUBSTRATE AND DEPOSITION PREVENTING PLATE USED FOR FILM FORMATION

BACKGROUND OF THE INVENTION

1. Field of the Invention

The present invention relates to sputtering apparatuses and more particularly to a sputtering apparatus capable of changing a distance between a substrate and a deposition preventing plate used for forming a film on a liquid crystal display device, a semiconductor, a magneto-optical recording disk, a magnetic recording disk and so on.

2. Description of the Background Art

Sputtering apparatuses are conventionally used to manufacture liquid crystal display devices, semiconductors, magneto-optical recording disks, magnetic recording disks and so on. The sputtering apparatuses used for mass production thereof include two kinds of apparatuses, namely, in-line sputtering apparatuses for carrying a substrate together with its holder and cluster tool sputtering apparatuses for carrying only a substrate.

In an in-line sputtering apparatus, a plurality of processing chambers such as a loading chamber, an unloading chamber and a film forming chamber are successively arranged in a linear or U shape manner. A substrate is held by a holder. A plurality of substrate holders pass through the processing chambers parallel to the substrate surfaces to successively form films on the substrates.

In the apparatus, a plurality of substrates are generally held on one substrate holder and carried by moving the substrate holder. In the film forming chamber, a deposition preventing plate for covering part of a substrate and an apparatus mechanism portion is provided so that an unnecessary film is not deposited on the substrate other than its prescribed portion and in a vacuum container.

Accordingly, the substrate is carried more easily than when only a substrate is carried, and the substrate is carried at high speed. Thus, the in-line sputtering apparatus has superior productivity. However, a relatively large gap has to be provided to avoid contact between a substrate and the deposition preventing plate or between a substrate holder and the deposition preventing plate while the substrate is being carried. Due to the large gap, an unnecessary film is deposited on the substrate holder and in the vacuum container. When such an unnecessary film exists and peels off, the substrate is tainted and the quality of a sputtered film is lowered. Further, in order to prevent deposition of a film on a substrate holder driving mechanism for moving a substrate holder, a large number of various deposition preventing plates have to be provided, and they have to be exchanged and washed constantly. Thus, maintenance becomes difficult.

On the other hand, in a cluster tool sputtering apparatus, a middle chamber, which contains a robot operating in a vacuum at the center of the apparatus, is provided and a plurality of processing chambers such as a film forming chamber, a loading chamber and an unloading chamber are arranged around the middle chamber. A film is formed on a substrate that is stopped and accurately positioned in the film forming chamber. Accordingly, a deposition preventing plate can be arranged sufficiently close to the substrate so that a film is not deposited on the substrate other than its prescribed portion and in a vacuum container at the time of film formation.

Accordingly, deposition of a film on an unnecessary portion can be minimized, and maintenance becomes easy because the number of components of the deposition preventing plate can be reduced. However, the robot, which operates in a vacuum, at the apparatus center can basically carry only one substrate at a time and has a limit in its substrate carrying capability. Thus, productivity is limited.

In recent years, several new sputtering apparatuses of the two kinds have been proposed. These techniques are disclosed in Japanese Patent Laying-Open Nos. 4-137522, 6-69316, 8-3744, and 9-143733, for example.

These new sputtering apparatuses are common in that substrate holders called substrate carts, trays or substrate carriers are used and that substrates are carried parallel to the substrate surfaces. For film formation, the substrates are attached to the substrate holders and moved in each processing chamber according to the purposes.

However, the sputtering apparatuses, which are considered to be improvements on the conventional in-line sputtering apparatuses, have not solved conventional problems with the in-line sputtering apparatuses. That is, the gap for preventing contact between the substrate and the deposition preventing plate or between the substrate holder and the deposition preventing plate during substrate carriage are still set to a fixed distance. Therefore, the problem that an unnecessary film is deposited on the substrate holder or in the vacuum container has not been improved.

SUMMARY OF THE INVENTION

An object of the present invention is to provide a sputtering apparatus capable of forming a good quality sputtered film.

Another object of the present invention is to provide a sputtering apparatus allowing easy maintenance.

Still another object of the present invention is to provide a sputtering apparatus capable of preventing damage to a substrate during substrate carriage.

According to one aspect of the present invention, a sputtering apparatus for forming a sputtered film on a substrate held on a substrate holder in a vacuum chamber includes a target, a deposition preventing plate provided between the target and the substrate holder, a substrate holder carrying mechanism, and a moving mechanism for moving the substrate holder carrying mechanism to change a distance between the substrate and the deposition preventing plate.

Since the moving mechanism moves the substrate holding carrying mechanism to change the distance between the substrate and the deposition preventing plate, the substrate can move close to the deposition preventing plate during film formation on the substrate and move away from the deposition preventing plate during substrate carriage. Accordingly, an unnecessary film will not deposit on the substrate holder or in the vacuum container, and maintenance of the substrate holder and the like can be made easier. Since an unnecessary film is not deposited, the substrate will not be tainted because of a peeled film. Thus, a good quality sputtered film can be formed on the substrate.

According to another aspect of the present invention, a sputtering apparatus for forming a sputtered film on a substrate held on a substrate holder in a vacuum chamber includes a target, a deposition preventing plate provided between the target and the substrate holder, and a moving mechanism for moving the deposition preventing plate to change a distance between the substrate and the deposition preventing plate.

Since the moving mechanism moves the deposition preventing plate to change the distance between the substrate and the deposition preventing plate, the substrate can move close to the deposition preventing plate during film formation on the substrate and move away from the deposition preventing plate during substrate carriage. Accordingly, an unnecessary film will not deposit on the substrate holder or in the vacuum container, and maintenance of the substrate holder and the like can be made easier. Since an unnecessary film is not deposited, the substrate will not be tainted because of a peeled film. Thus, a good quality sputtered film can be formed on the substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A sputtering apparatus according to a first embodiment of the present invention will be described in the following with reference to the drawings.

Figure 1:
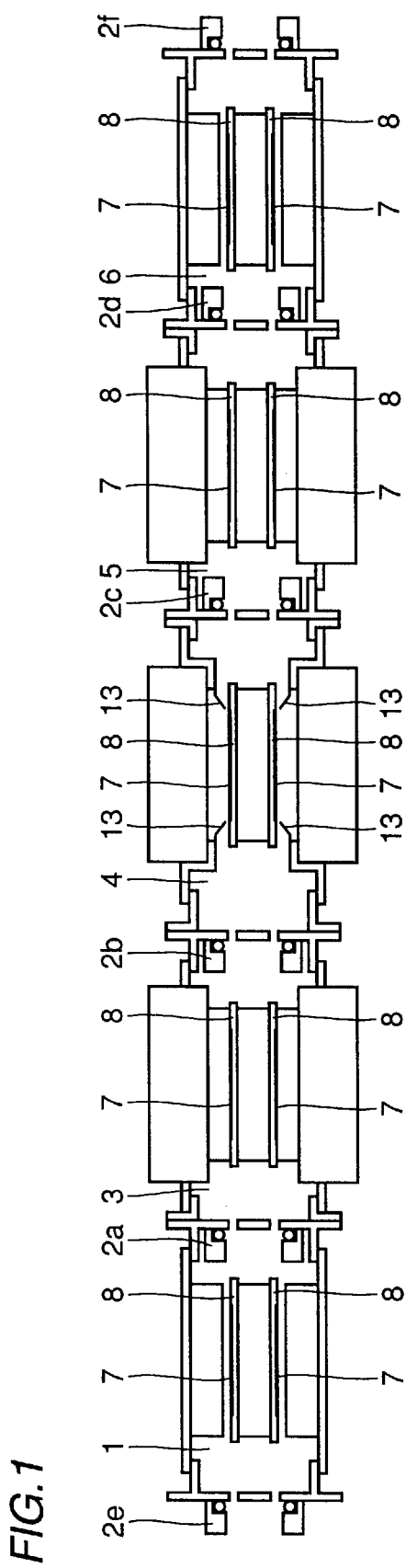
FIGS. 1 and 2 are plan and front views for describing a schematic structure of a sputtering apparatus in a first embodiment of the present invention.
Figure 2:
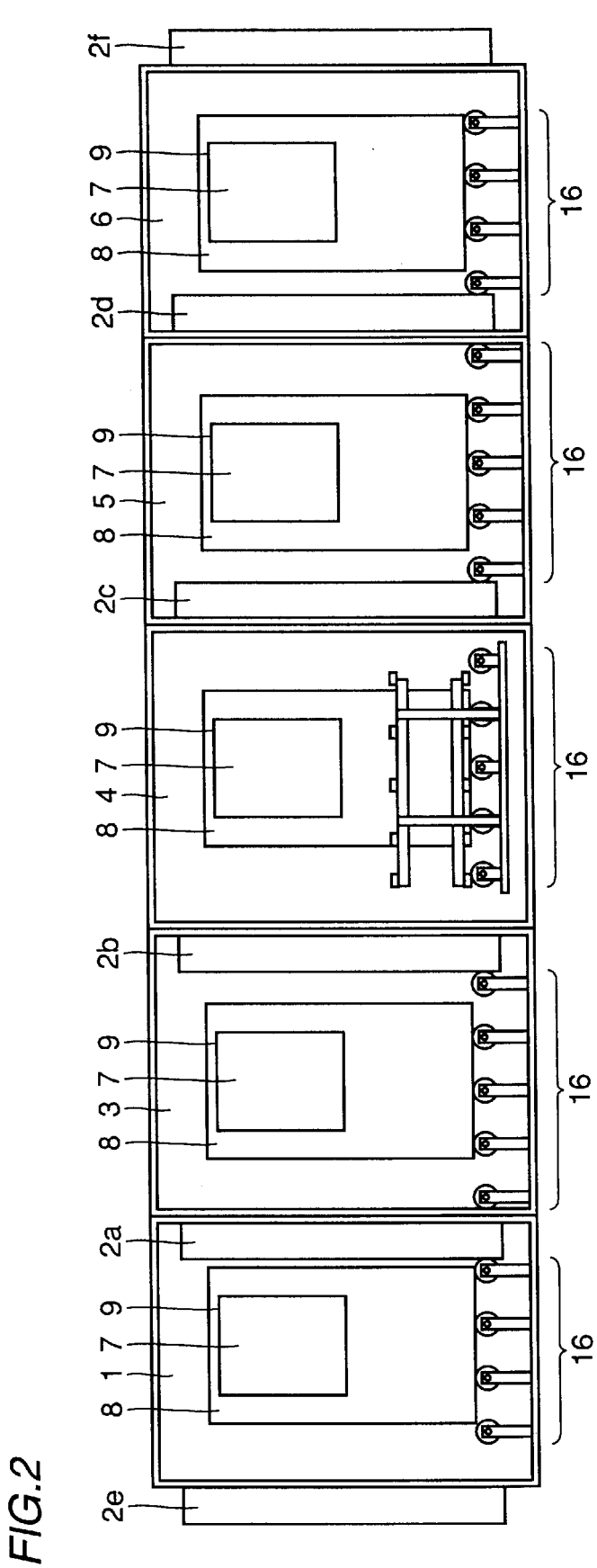

Referring to FIGS. 1 and 2, the sputtering apparatus includes a loading chamber 1, a heating chamber 3 connected to loading chamber 1 via a gate valve 2a capable of opening and closing, a film forming chamber 4 connected to heating chamber 3 via a gate valve 2b capable of opening and closing, a cooling chamber 5 connected to film forming chamber 4 via a gate valve 2c capable of opening and closing, and an unloading chamber 6 connected to cooling chamber 5 via a gate valve 2d capable of opening and closing. Gate valves 2e and 2f capable of opening and closing are provided at the entrance of loading chamber 1 and at the exit of unloading chamber 6, respectively.

Referring to FIGS. 1 and 2, the flow of a substrate in the sputtering apparatus will be described.

1) A substrate 7 is attached in a substrate holding hole 9 of a substrate holder 8 as a tray in the air.

2) Gate valve 2e at the entrance of loading chamber 1 is opened. After substrate holder 8 is carried in loading chamber 1, gate valve 2e at the entrance of loading chamber 1 is closed.

3) In loading chamber 1, an exhausting system, not shown, causes air pressure to attain a prescribed degree of vacuum.

4) After a prescribed degree of vacuum is obtained, gate valve 2a between loading chamber 1 and heating chamber 3 is opened, substrate holder 8 is carried from loading chamber 1 to heating chamber 3, and then gate valve 2a is closed.

5) In heating chamber 3, substrate 7 attached to substrate holder 8 is heated to a prescribed temperature.

6) After substrate 7 is heated to a prescribed temperature, gate valve 2b between heating chamber 3 and film forming chamber 4 is opened, substrate holder 8 is carried to film forming chamber 4, and then gate valve 2b is closed.

7) In film forming chamber 4, film formation is carried out on substrate 7 attached to substrate holder 8.

8) After film formation on substrate 7 is completed, gate valve 2c between film forming chamber 4 and cooling chamber 5 is opened, substrate holder 8 is carried to cooling chamber 5, and then gate valve 2c is closed.

9) In cooling chamber 5, substrate 7 attached to substrate holder 8 is cooled to a prescribed temperature.

10) After substrate 7 is cooled to a prescribed temperature, gate valve 2d between cooling chamber 5 and unloading chamber 6 is opened, substrate holder 8 is carried to unloading chamber 6, and then gate valve 2d is closed.

11) In unloading chamber 6, an air intake system, not shown, supplies air from the outside to attain the atmospheric pressure.

12) After the atmospheric pressure is attained in unloading chamber 6, gate valve 2f at the exit of unloading chamber 6 is opened, substrate holder 8 is carried from unloading chamber 6 to the outside of the apparatus, and then gate valve 2f is closed.

13) In substrate holder 8 that is discharged to the outside of the. apparatus, substrate 7 that has gone through film formation is removed from substrate holding hole 9.

14) In substrate holder 8 from which substrate 7 is removed, another substrate 7 that has not been processed is attached again in substrate holding hole 9. Substrate holder 8 is again carried to loading chamber 1.

Since the series of processes are carried out in parallel and in a successive manner as described above, high productivity is attained. Here, substrate holder 8 is carried by a substrate holder carrying mechanism 16 provided in each processing chamber.

Although one substrate 7 is attached to one surface of substrate holder 8 in this embodiment shown in FIG. 1, the structure is actually not limited to it.

Figure 3:
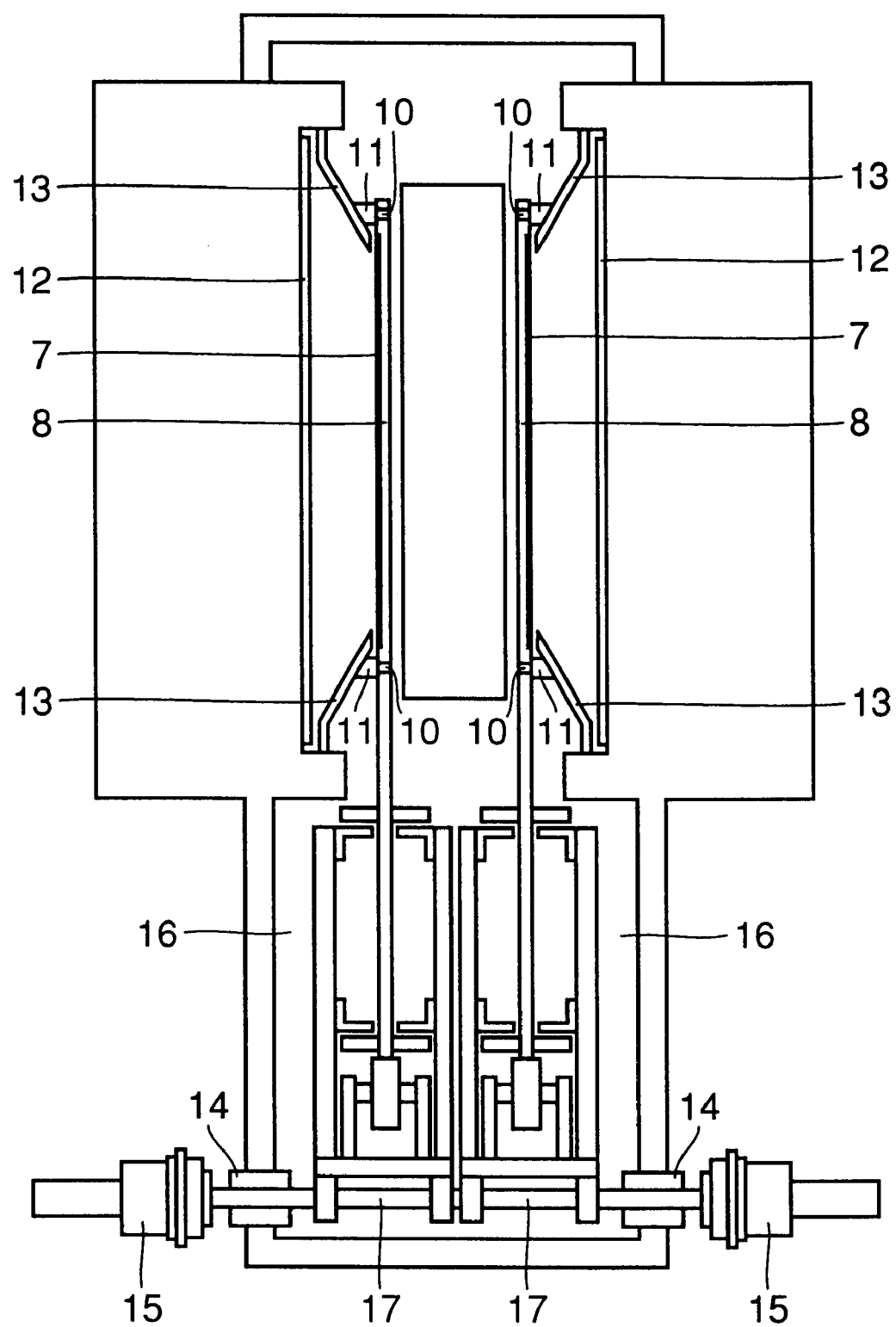
FIGS. 3 and 4 are side views for describing an inner structure of a film forming chamber (during film formation on a substrate and during substrate carriage, respectively) in the first embodiment of the present invention.

FIG. 3 is a side view of a main part for describing an inner structure of film forming chamber 4 during film formation in the sputtering apparatus in the first embodiment. Film forming chamber 4 includes a target 12 for forming a film on a substrate 7, a deposition preventing plate 13 provided with a locating pin 11, a mechanism 14 for introducing driving force in a vacuum chamber, a driving force generating mechanism 15 for transmitting driving force in film forming chamber (vacuum chamber) 4 via mechanism 14, a substrate holder carrying mechanism 16 for carrying substrate holder 8, and a ball thread 17 for moving substrate holder carrying mechanism 16 by rotation.

For film formation, substrate 7 is fixed in a stationary state at a position opposite to target 12. In film forming chamber 4, deposition preventing plate 13 for covering part of substrate 7 is provided between substrate 7 and target 12 so that a film is not formed on substrate 7 other than its prescribed portion. Deposition preventing plate 13 is provided with locating pin 11. Substrate holder 8 for holding substrate 7 is provided with a locating hole 10. When locating pin 11 is inserted in locating hole 10, the positional relationship between substrate holder 8 and deposition preventing plate 13 is determined and fixed. As a result, the positional relationship between substrate 7 held on substrate holder 8 and deposition preventing plate 13 is also determined.

The tip of deposition preventing plate 13 and the surface of substrate 7 are closely arranged to have a prescribed gap, and the distance is approximately 0.1 to 5 mm. Since deposition preventing plate 13 accordingly covers substrate 7 other than its prescribed portion when observed from target 12, film deposition on an unnecessary portion can be prevented.

Figure 4:
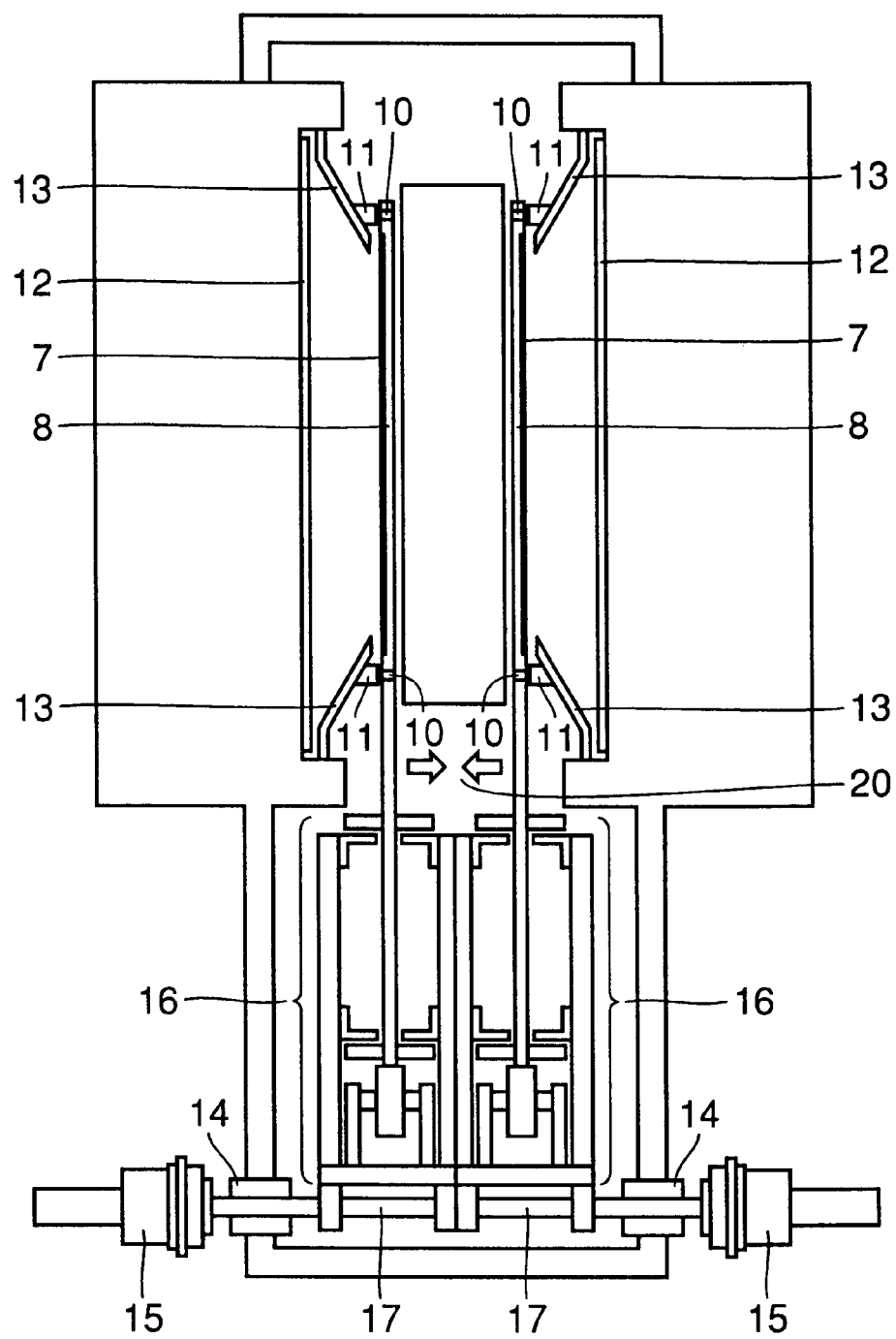

FIG. 4 is a side view for describing the inside of the film forming chamber when a substrate moves in the sputtering apparatus.

Substrate 7 is carried vertically to the sheet plane of FIG. 4 when it is carried in and out. When substrate 7 is carried, substrate 7 and substrate holder 8 move vertically to the surface of substrate 7 and away from deposition preventing plate 13 (in the direction denoted by arrow 20) so as to avoid contact of substrate 7 to be carried or substrate holder 8 with deposition preventing plate 13. Thus, locating pin 11 is pulled out of locating hole 10. Thereafter, carriage of substrate 7 and substrate holder 8 is started. The distance between the tip of deposition preventing plate 13 and the surface of substrate 7 at this time is approximately 5 to 30 mm. This has to be a distance enough to avoid contact of locating pin 11 with substrate 7 or substrate holders 8. Accordingly, the distance is not limited to the value above but a suitable distance is selected according to an apparatus structure.

The above described movement is an operation related to carriage out of a substrate holder after film formation, and the movement for locating a substrate holder to a prescribed position (carriage in) for film formation is opposite from the operation above.

In the sputtering apparatus, locating pin 11 is inserted in locating hole 10 because substrate 7 and deposition preventing plate 13 approach each other during film formation on substrate 7, and locating pin 11 is pulled out when substrate 7 moves. However, locating hole 10 is not always necessary and may be omitted. In this structure as well, locating pin 11 is pressed against substrate holder 8 and, as a result, the distance between substrate 7 and deposition preventing plate 13 is obtained accurately.

In this embodiment, substrate 7 is carried by movement of substrate holder 8 as described above. The movement of substrate holder 8 indicated by arrows 20 in FIG. 4 is achieved when substrate holder carrying mechanism 16 is moved by rotation of ball thread 17. Ball thread 17 is driven and rotated by driving force that is generated by driving force generating device 15 outside the vacuum container and introduced in the vacuum chamber by mechanism 14 for introducing driving force in the vacuum chamber. Further, substrate holder 8 is also carried by utilizing the driving force. It is noted that substrate holder carrying mechanism 16 is provided with a threaded hole that engages with ball thread 17.

Although substrate 7 is moved close to and away from deposition preventing plate 13 by using ball thread 17 in this embodiment, the structure is not limited to it but a link mechanism, a cum mechanism, a gear and the like may be used.

Although the in-line sputtering apparatus, which is linearly arranged, is used and described as an apparatus structure in this embodiment, the structure is not limited to it. The present invention can also be applied to an in-line sputtering apparatus having another structure and an improvement on the above described in-line sputtering apparatus.

As described above, the sputtering apparatus in this embodiment is advantageous in that it can solve both of the problem of contact of substrate 7 and substrate holder 8 with deposition preventing plate 13 during carriage and the problem of film deposition on an unnecessary portion during film formation by causing substrate 7 and substrate holder 8, to which substrate 7 is attached, to move dose to and away from deposition preventing plate 13. Further, substrate 7 can be attached to and removed from substrate holder 8 outside the apparatus, and therefore the sputtering apparatus is also advantageous in that maintenance such as washing of substrate holder 8 can be carried out outside the apparatus.

Second Embodiment

Figure 5:
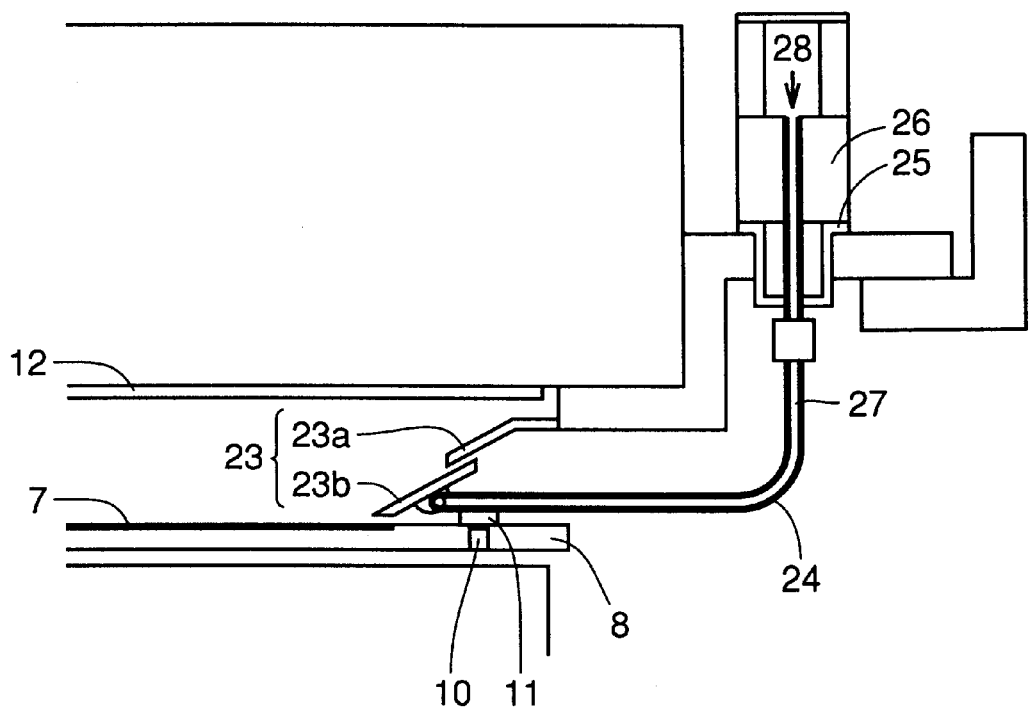
FIGS. 5 and 6 are plan views of a main part for describing an inner structure of a film forming chamber (during film formation on a substrate and during substrate carriage, respectively) in a second embodiment of the present invention.
Figure 6:
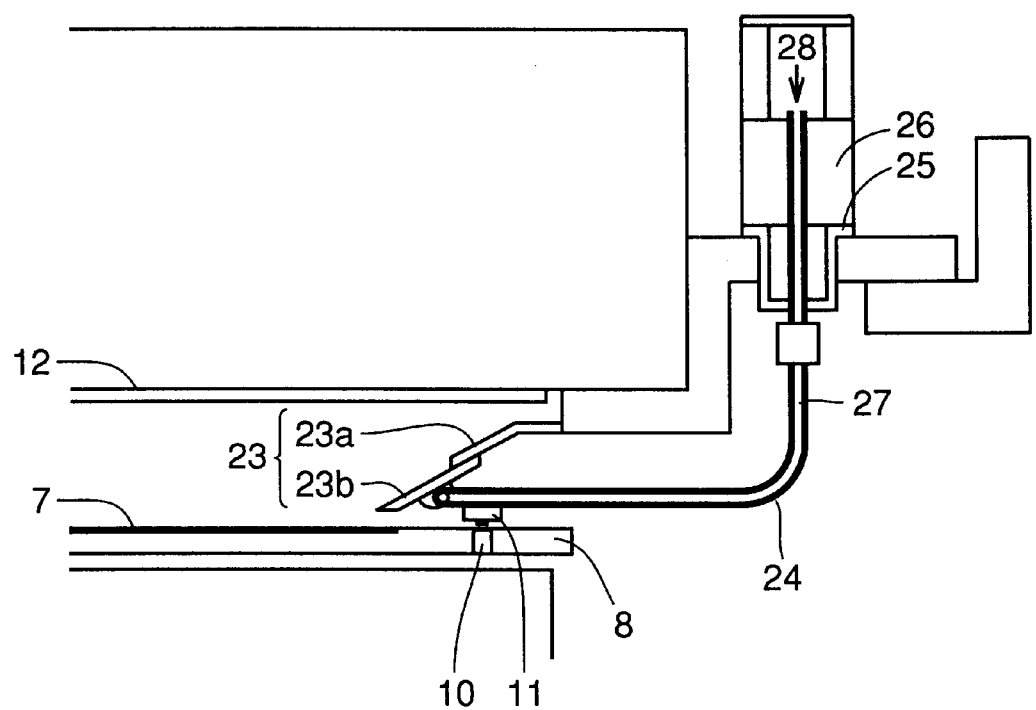

FIGS. 5 and 6 are plan views of a main part for describing an inner structure of film forming chamber 4 in a sputtering apparatus in a second embodiment. Since the parts not shown in FIG. 5 or 6 have the same structure as the sputtering apparatus in the first embodiment shown in FIGS. 1 and 2, the detailed description thereof will not be repeated.

Film forming chamber 4 of the sputtering apparatus in the second embodiment includes a deposition preventing plate 23 including a deposition preventing plate fixed portion 23a and a deposition preventing plate movable portion 23b, a driving force delivery body 24 provided with locating pin 11 and a cooling water hole 27 for circulating cooling water, a mechanism 25 for introducing driving force in a vacuum container, a driving force generating device 26 for transmitting driving force in film forming chamber (vacuum chamber) 4 via mechanism 25, and a cooling water carrying mechanism 28.

Substrate holder 8 carried in film forming chamber 4 is stopped at a prescribed position, and film formation is performed at that position. Near the position where the holder is stopped in film forming chamber 4, deposition preventing plate 23 is provided for each substrate attached to substrate holder 8. Deposition preventing plate 23 is arranged between target 12 and substrate 7, and the plate is close to substrate 7 during film formation (while the substrate holder is stopped) as shown in FIG. 5. Accordingly, a sputtered film is prevented from sticking to such a portion of substrate 7 that does not have to be film-formed and to substrate holder 8. Further, deposition preventing plate 23 is separated from substrate 7 during carriage as shown in FIG. 6. Accordingly, contact between substrate 7 and deposition preventing plate 23 during carriage can be prevented, and therefore a defect in the sputtering apparatus and damage to substrate 7 can be prevented.

The structure and operation of deposition preventing plate 23 will be described in detail in the following.

Deposition preventing plate 23 includes deposition preventing plate fixed portion 23a and deposition preventing plate movable portion 23b. Deposition preventing plate fixed portion 23a is fixed on a side of target 12, and deposition preventing plate movable portion 23b is supported by driving force delivery body 24. Driving force delivery body 24 is connected to driving force generating device 26 outside the vacuum container (film forming chamber 4), and can be moved vertically in the figure by driving force that is generated by driving force generating device 26 (such as an air cylinder and a motor) and introduced into the vacuum container by mechanism 25 for introducing driving force in the vacuum container (such as magnetic coupling, bellows, and magnetic hydraulic sealing).

Driving force delivery body 24 that supports deposition preventing plate movable portion 23b is provided with locating pin 11. Locating pin 11 is formed to fit into locating hole 10, which is provided in substrate holder 8, when driving force delivery body 24 is driven downward (to the side of the substrate).

In the sputtering apparatus having deposition preventing plate 23 and its driving mechanism of such a structure, substrate 7 is stopped and driving force generating device 26 drives driving force delivery body 24 downward (to the side of the substrate) during film formation as shown in FIG. 5. At this time, locating pin 11 fits into locating hole 10 of substrate holder 8, and the positional relationship between driving force delivery body 24 and substrate holder 8, that is, the position of substrate 7 in film forming chamber 4 is determined.

At this time, the tip of deposition preventing plate movable portion 23b and the surface of substrate 7 approach each other to have a prescribed gap (approximately 0.1 to 5 mm), and deposition preventing plate fixed portion 23a and deposition preventing plate movable portion 23b are arranged to partially be overlapped when observed from target 12. Accordingly, in this state, such a portion of substrate 7 that does not have to film-formed as well as substrate holder 8 are covered when observed from target 12. Thus, film deposition on an unnecessary portion can be prevented.

Meanwhile, when substrate holder 8 is carried, driving force generating device 26 drives driving force delivery body 24 upward (to the side of the target) as shown in FIG. 6, and locating pin 11 is released from locating hole 10. Then, the distance from the tip of deposition preventing plate movable portion 23b to the surface of substrate 7 becomes approximately 5 to 30 mm. The distance only has to be enough to avoid contact of locating pin 11 to substrate 7 or substrate holder 8, and it is not limited to the value above. Further, a suitable distance is selected according to an apparatus structure.

When the interval from substrate 7 or substrate holder 8 to deposition preventing plate movable portion 23b becomes large enough, carriage of substrate holder 8 is started. According to the apparatus, contact between substrate 7 (or substrate holder 8) and deposition preventing plate 23 can be prevented, and a defect and substrate damage can be suppressed.

Deposition preventing plate 23 arranged near substrate 7 and target 12 is heated and increased in temperature as film formation continues. Temperature increase in deposition preventing plate 23 results in thermal expansion thereof, causes deposits to be released from deposition preventing plate 23 (particle generation), and taints substrate 7 as a result. Accordingly, temperature increase in deposition preventing plate 23 has to be suppressed as much as possible. Then, cooling water hole 27 is provided in driving force delivery body 24 and cooling water is circulated using cooling water hole 27 in this embodiment (in FIGS. 5 and 6, only the portion for introducing cooling water to deposition preventing plate 23 is shown, and the portion for draining cooling water from deposition preventing plate 23 is omitted). Cooling water hole 27 is arranged to surround and to be close to deposition preventing plate 23 so as to efficiently cool the deposition preventing plate 23. By thus doing, generation of particles can be suppressed. Other structures in which a hole for passing cooling water in deposition preventing plate 23, for example, can also be adopted as the method of cooling deposition preventing plate 23.

Third Embodiment

Figure 7:
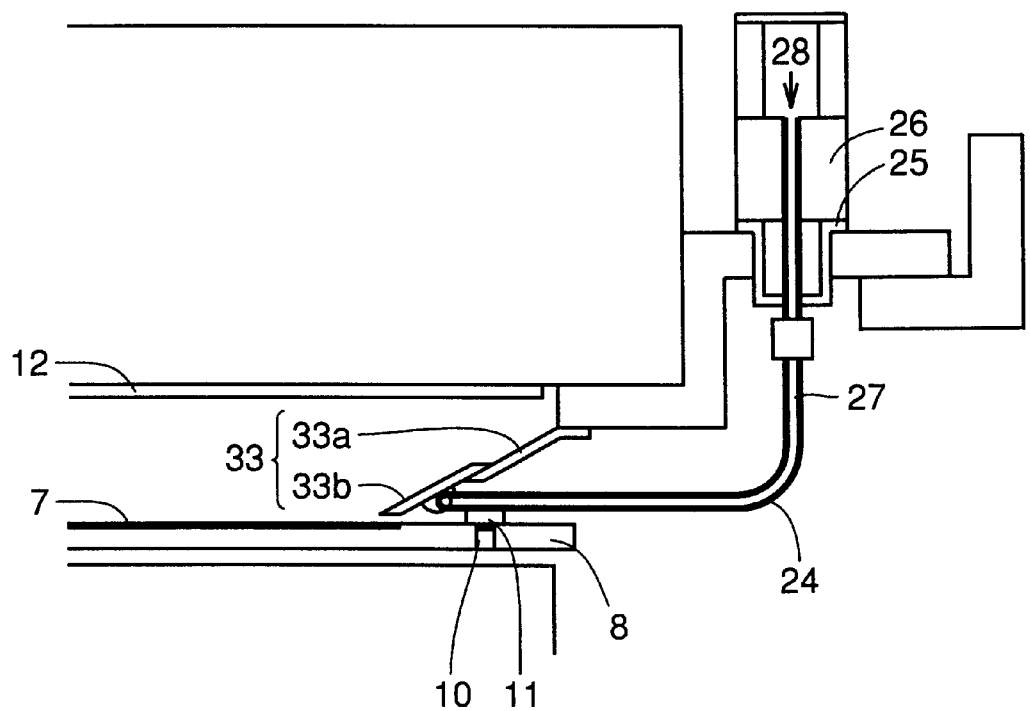
FIGS. 7 and 8 are plan views of a main part for describing an inner structure of a film forming chamber (during film formation on a substrate and during substrate carriage, respectively) in a third embodiment of the present invention.
Figure 8:
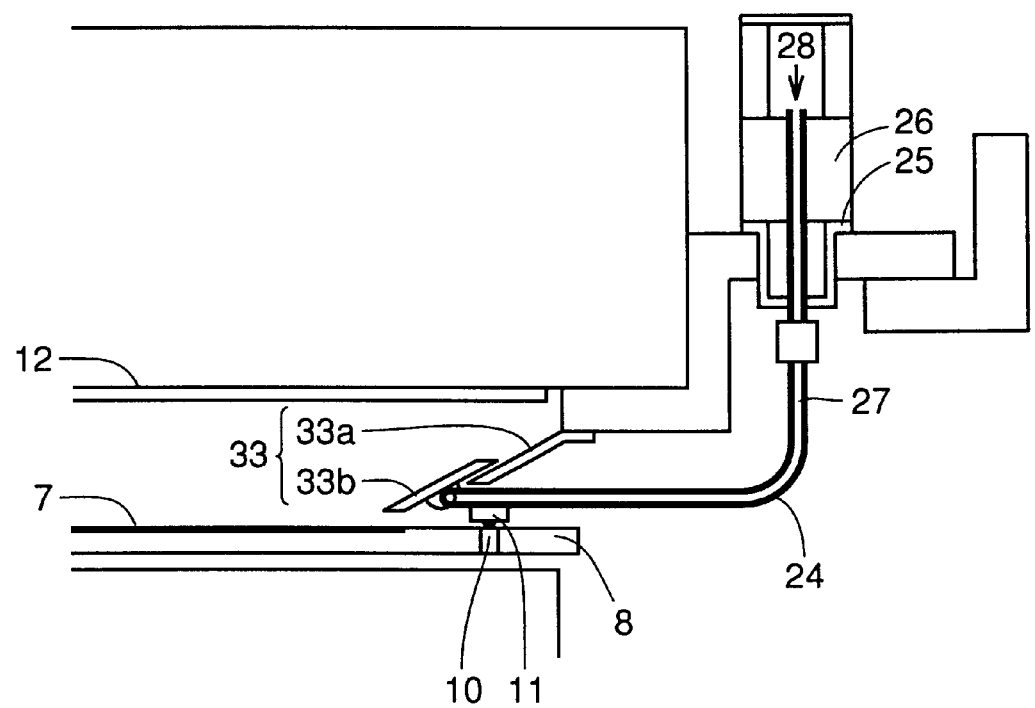

FIGS. 7 and 8 show another example of the structure of deposition preventing plate 23 and its driving mechanism in FIGS. 5 and 6. FIG. 7 shows the state in film forming chamber 4 during film formation, and FIG. 8 is a plan view of a main part for showing the inside of film forming chamber 4 during substrate carriage.

A deposition preventing plate 33 in FIGS. 7 and 8 has the positional relationship between a deposition preventing plate fixed portion 33a and a deposition preventing plate movable portion 33b opposite from that in deposition preventing plate 23 shown in FIGS. 5 and 6. Even with such a structure, a sputtered film can be prevented from sticking to such a portion of substrate 7 that has not be film-formed as well as substrate holder 8, and contact between substrate 7 and deposition preventing plate 33 during carriage can be prevented.

Fourth Embodiment

Figure 9:
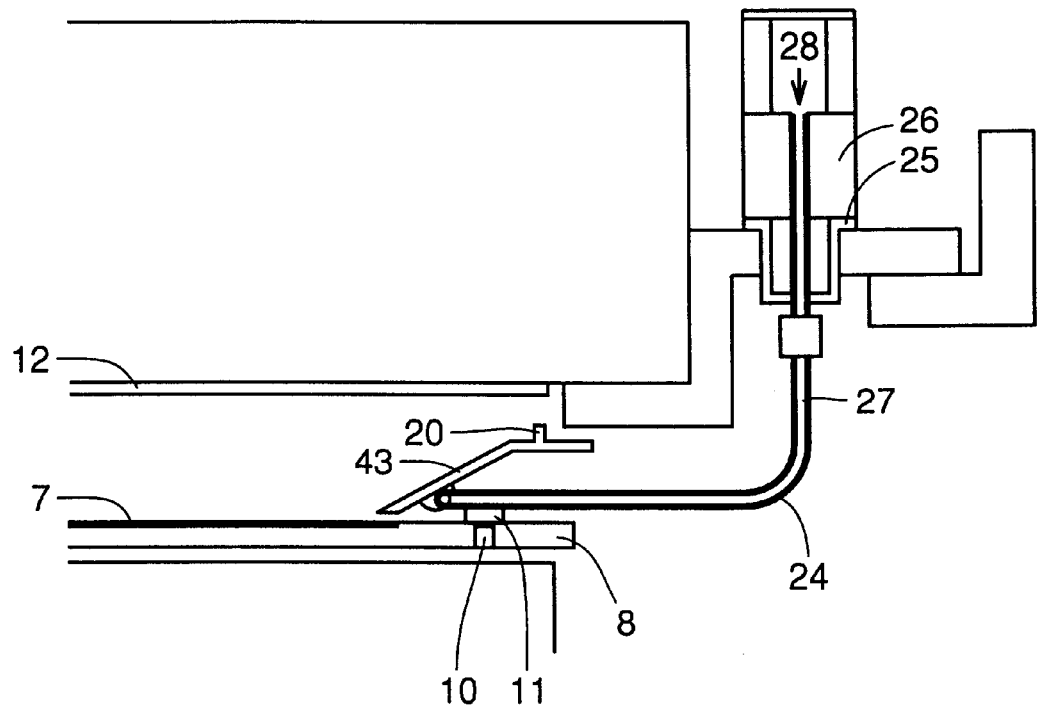
FIGS. 9 and 10 are plan views of a main part for describing an inner structure of a film forming chamber (during film formation on a substrate and during substrate carriage, respectively) in a fourth embodiment of the present invention.
Figure 10:
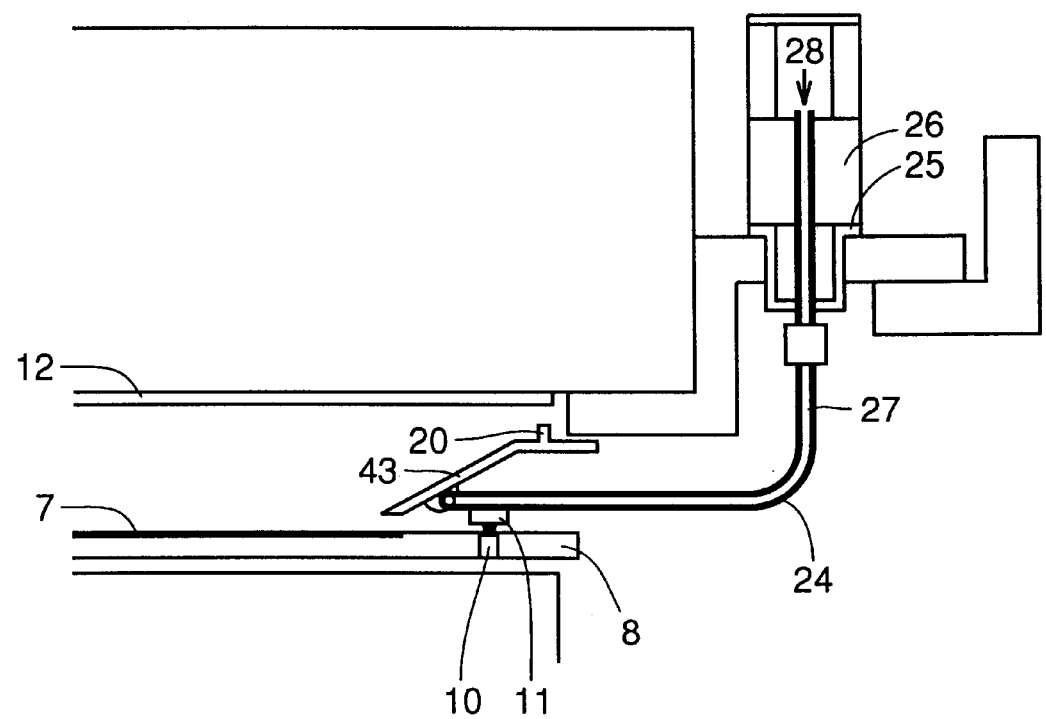

Although part of deposition preventing plate 23 or 33 (deposition preventing plate movable portion 23b or 33b) moves in the second or third embodiment, the entire deposition preventing plate 43 moves in this embodiment as shown in FIGS. 9 and 10.

In this case, when an projection 20 is provided on deposition preventing plate 43 on the side of target 12, and deposition preventing plate 43 is moved to the side of substrate holder 8, creation of a gap between target 12 and deposition preventing plate 43 can be prevented. Deposition of an unnecessary film due to this gap can be prevented.

Fifth Embodiment

Figure 11:
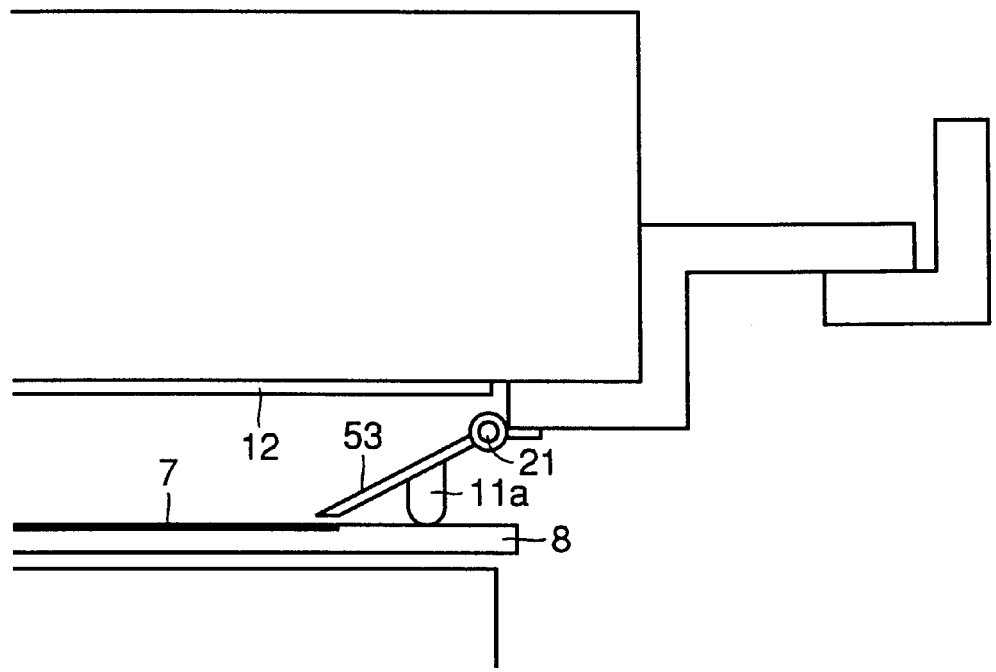
FIGS. 11 and 12 are plan views of a main part for describing an inner structure of a film forming chamber (during film formation on a substrate and during substrate carriage, respectively) in a fifth embodiment of the present invention.
Figure 12:
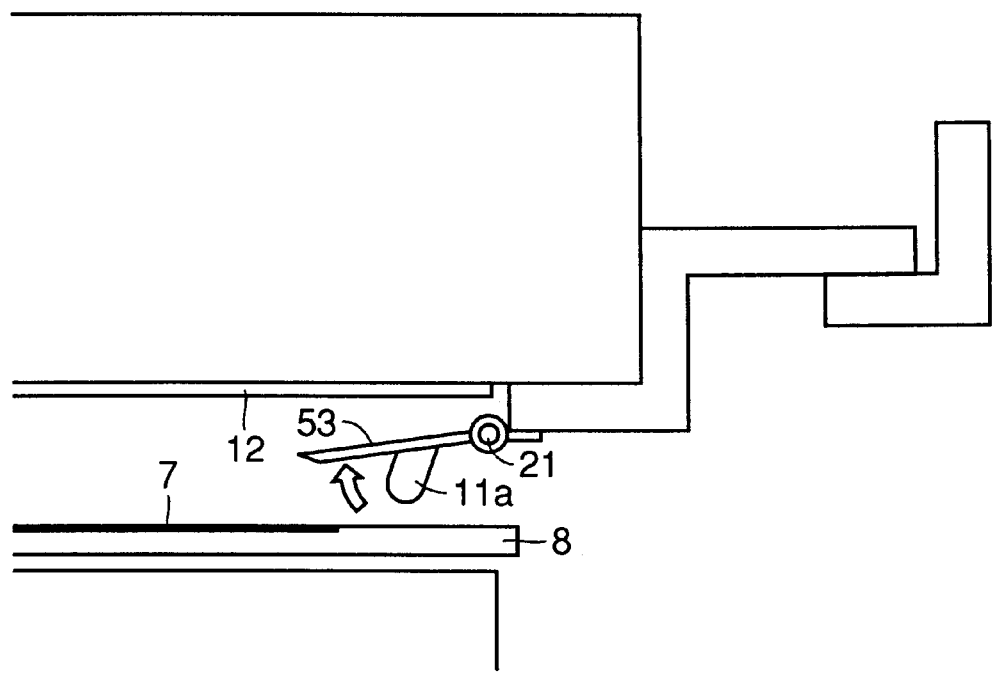

This embodiment is a variation of the moving mechanism of deposition preventing plate 43 in the fourth embodiment. FIGS. 11 and 12 show an example of the structure of a deposition preventing plate 53 and its moving mechanism in this embodiment.

In this embodiment, deposition preventing plate 53 rotates around a rotation shaft 21. In this case as well, rotation driving force for rotating operation, not shown, is generated by an driving force generating device outside a vacuum container and introduced in the vacuum container by a mechanism for introducing driving force in the vacuum container similarly to the above described embodiments.

Substrate holder 8 is not provided with a locating hole, and deposition preventing plate 53 is located by causing locating pin 11a to abut against substrate holder 8. Since deposition preventing plate 53 can be attached accurately by rotation shaft 21, a high distance accuracy can be attained even when locating pin 11a is located by contact with substrate holder 8.

Although the above described embodiments describe a case where an in-line sputtering apparatus having linearly arranged processing chambers is used as an apparatus structure, the embodiments are not limited to the apparatus but may be applied to an in-line sputtering apparatus having other structures, an improvement on the above described in-line sputtering apparatus, or a cluster tool sputtering apparatus.

In the sputtering apparatus of the present invention, at least part of the deposition preventing plate, which covers part of a substrate so that a film is not formed on a portion other than a prescribed portion, moves dose to the substrate when film formation is carried out on the substrate and moves away from the substrate when the substrate is carried. Since the deposition preventing plate and the substrate are close to each other during film formation on the substrate, film formation on an unnecessary portion can be prevented. Since the deposition preventing plate and the substrate are far from each other during substrate carriage, contact between the substrate and the deposition preventing plate can be avoided, and substrate damage and an apparatus defect can be suppressed.

Since driving force for driving the deposition preventing plate is generated outside the vacuum container and introduced in the vacuum container by the mechanism for introducing driving force in the vacuum container, the driving force generating mechanism has not be provided in the vacuum container.

When the mechanism for cooling the deposition preventing plate is provided in the driving force delivery body for transmitting driving force, influence of particles, for example, can be suppressed.

Since the deposition preventing plate is provided with the locating member, the positional relationship between the substrate holder and the deposition preventing plate can be determined accurately.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A sputtering apparatus for forming a sputtered film on a substrate holder while carrying the substrate holder between vacuum chambers that are connected to each other via a gate valve, comprising:
   a target
   a deposition preventing plate provided between said target and said substrate holder;
   a substrate holder carrying mechanism that carries said substrate holder in a direction parallel to the surface of said substrate between the vacuum chambers; and
   a moving mechanism for moving said substrate holder carrying mechanism to change a distance between said substrate and said deposition preventing plate.

2. The sputtering apparatus according to claim 1, wherein said moving mechanism includes
   a driving force generating device provided outside the vacuum chamber,
   a driving force introducing mechanism connected to said driving force generating device, and
   a substrate holder moving mechanism connected to said driving force introducing mechanism.

3. The sputtering apparatus according to claim 2, wherein said substrate holder carrying mechanism includes a threaded hole, and
   said substrate holder moving mechanism includes a ball thread connected to said driving force introducing mechanism and engaging with said threaded hole.

4. The sputtering apparatus according to claim 1, wherein said deposition preventing plate is provided with a locating pin, and
   said substrate holder is provided with a locating hole in which said locating pin is inserted.

5. The sputtering apparatus according to claim 1, wherein said deposition preventing plate includes a fixed portion and a movable portion, and wherein said fixed portion and said movable portion are formed of mutually separable plate-shaped members.

6. The sputtering apparatus of claim 1, wherein the vacuum chambers are linearly arranged.

7. A sputtering apparatus for forming a sputtered film on a substrate held on a substrate holder in a vacuum chamber, comprising:
   a target;
   a deposition preventing plate provided between said target and said substrate holder; and
   a moving mechanism for moving said deposition preventing plate to change a distance between said substrate and said deposition preventing plate.

8. The sputtering apparatus according to claim 7, wherein said moving mechanism includes
   a driving force generating device, and
   a driving force delivery body connected to said driving force generating device.

9. The sputtering apparatus according to claim 8, wherein said deposition preventing plate includes
   a fixed portion fixed on a side of said target, and
   a movable portion fixed to said driving force delivery body.

10. The sputtering apparatus according to claim 9, wherein said fixed portion is provided in front of said movable portion when observed from said target.

11. The sputtering apparatus according to claim 6, wherein said movable portion is provided in front of said fixed portion when observed from said target.

12. The sputtering apparatus according to claim 8, wherein said driving force delivery body is provided with a locating pin, and
   said substrate holder is provided with a locating hole in which said locating pin is inserted.

13. The sputtering apparatus according to claim 8, wherein a cooling water hole for circulating cooling water is formed inside said driving force delivery body.

14. The sputtering apparatus according to claim 7, wherein said deposition preventing plate is provided rotatably around a rotation shaft, and said deposition preventing plate includes a locating pin abutting against said substrate holder.

* * * * *

UNITED STATES PATENT AND TRADEMARK OFFICE
CERTIFICATE OF CORRECTION

PATENT NO. : 6,309,525 B2
DATED : October 30, 2001
INVENTOR(S) : Futagawa et al.

It is certified that error appears in the above-identified patent and that said Letters Patent is hereby corrected as shown below:

<u>Column 9,</u>
Line 44, claim 1, reads as follows:
  A sputtering apparatus for forming a sputtered film on a substrate held on a substrate holder while carrying the substrate holder between vacuum chambers that are connected to each other via a gate valve, comprising:
      a target
      a deposition preventing plate provided between said target and said substrate holder;
      a substrate holder carrying mechanism that carries said substrate holder in a direction parallel to the surface of said substrate between the vacuum chambers; and
      a moving mechanism for moving said substrate holder carrying mechanism to change a distance between said substrate and said deposition preventing plate.

Signed and Sealed this

Seventeenth Day of February, 2004

JON W. DUDAS
*Acting Director of the United States Patent and Trademark Office*